(12) United States Patent
Piccione

(10) Patent No.: US 6,278,331 B1
(45) Date of Patent: Aug. 21, 2001

(54) SYSTEM AND METHOD FOR COMPENSATING WAFER PARAMETERS

(75) Inventor: James M. Piccione, Los Gatos, CA (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/282,081

(22) Filed: Mar. 30, 1999

(51) Int. Cl.[7] .............................. H03L 7/08; H03B 5/04
(52) U.S. Cl. .............................. 331/17; 331/34; 331/57; 331/175; 331/176; 331/177; 331/179; 330/107; 330/109; 330/279; 455/126
(58) Field of Search ................... 331/158, 175, 331/177, 179, 17, 57; 330/107, 109, 129, 279; 455/126

(56) References Cited

U.S. PATENT DOCUMENTS

| | | | |
|---|---|---|---|
| 5,847,616 | * 12/1998 | Ng et al. | 331/57 |
| 5,966,054 | * 10/1999 | May et al. | 331/177 |
| 6,011,386 | * 1/2000 | Li et al. | 323/313 |
| 6,057,735 | * 12/1998 | Cloutier | 330/279 |
| 6,169,457 | * 10/1998 | Ichimaru | 331/17 |

\* cited by examiner

*Primary Examiner*—David Nelms
*Assistant Examiner*—Reneé R. Berry
(74) *Attorney, Agent, or Firm*—Stanton C. Braden

(57) ABSTRACT

The present invention relates to a system and method for compensating IC parameters. According to an embodiment of the present invention, a die of an IC wafer is coupled with a compensation circuit that classifies the die into various types. Examples of types include fast, typical, and slow. The assigned type may be used in a special oscillator that compensates for variations from a die to a predetermined criteria. According to an embodiment of the present invention, a slow die directs a signal that moves through a relatively short path, a fast die directs a signal that moves through a relatively long path, and a typical die directs a signal that moves through a relatively medium length path in the compensation circuit. Accordingly, each die on a wafer may be coupled with a compensation circuit such that the compensation circuit selects a path of a circuit that adjusts the frequency produced by the dies to produce a batch of ICs that would meet the predetermined criteria for the vast majority of the dies. A large number of useable Ics would be produced by adjusting the frequency produced by the ICs which would conventionally not meet the predetermined criteria to a frequency that does meet the predetermined criteria.

9 Claims, 3 Drawing Sheets

SYSTEM AND METHOD FOR COMPENSATING WAFER PARAMETERS

FIELD OF THE INVENTION

The present invention relates to integrated circuits. In particular, the present invention relates to adjusting parameters of dies of integrated circuit wafers.

BACKGROUND OF THE INVENTION

Integrated circuits (ICs) are typically manufactured as part of wafers which include many dies. Each of these dies may be integrated circuits designed to meet certain predefined criterias. However, although the integrated circuit process attempts to meet these predefined criterias, there is typically a substantial distribution of the resulting ICs in meeting these criterias. An example of a predefined criteria is a predetermined speed at which the IC runs. If some of the ICs are out of the acceptable range of meeting the predetermined criteria, they are typically thrown away. For example, there may be 1,000–2,000 dies on a wafer. If a predefined criteria for these dies is a given operating speed of the die, then the wafer typically produces a percentage of dies that are too fast to be within the predefined operating speed as well as another percentage of dies that are too slow to be within the predefined operating speed. These dies that are either too fast or too slow are typically thrown away. Since the cost of the production of IC wafers are high, it is extremely expensive to throw away a substantial portion of the wafer.

It would be desirable to be able to use a higher percentage of dies on a wafer. The present invention addresses such a need.

SUMMARY OF THE INVENTION

The present invention relates to a system and method for compensating IC parameters. According to an embodiment of the present invention, a die of an IC wafer is coupled with a compensation circuit that classifies the die into various types. Examples of types include fast, typical, and slow. The assigned type may be used in a special oscillator that compensates for variations from the die to a predetermined criteria. The die is compared to the predetermined criteria. According to an embodiment of the present invention, a slow die directs a signal that moves through a relatively short path, a fast die directs a signal that moves through a relatively long path, and a typical die directs a signal that moves through a relatively medium length path in the compensation circuit. Accordingly, each die on a wafer may be coupled with a compensation circuit such that the compensation circuit selects a path of a circuit that adjusts the frequency produced by the dies to produce a batch of ICs that would meet the predetermined criteria for the vast majority of the dies. A large number of useable Ics would be produced by adjusting the frequency produced by the ICs which would conventionally not meet the predetermined criteria to a frequency that does meet the predetermined criteria.

A system according to an embodiment of the present invention for adjusting a frequency produced by an integrated circuit is presented. The system comprises an oscillator reflecting a first frequency of an integrated circuit. The system also includes a speed comparator coupled with the oscillator, the speed comparator being configured to classify the first frequency to a type. A frequency synthesizer coupled with the speed comparator is also included, wherein the frequency synthesizer produces a signal with a second frequency.

A method according to an embodiment for adjusting a frequency produced by an integrated circuit is also presented. The method comprises providing a first frequency of an integrated circuit. The method also includes classifying the first frequency to a type, and producing a signal with a second frequency.

DETAILED DESCRIPTION OF THE PREFERRED EMBODIMENTS

The following description is presented to enable one of ordinary skill in the art to make and to use the invention and is provided in the context of a patent application and its requirements. Various modifications to the preferred embodiments will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
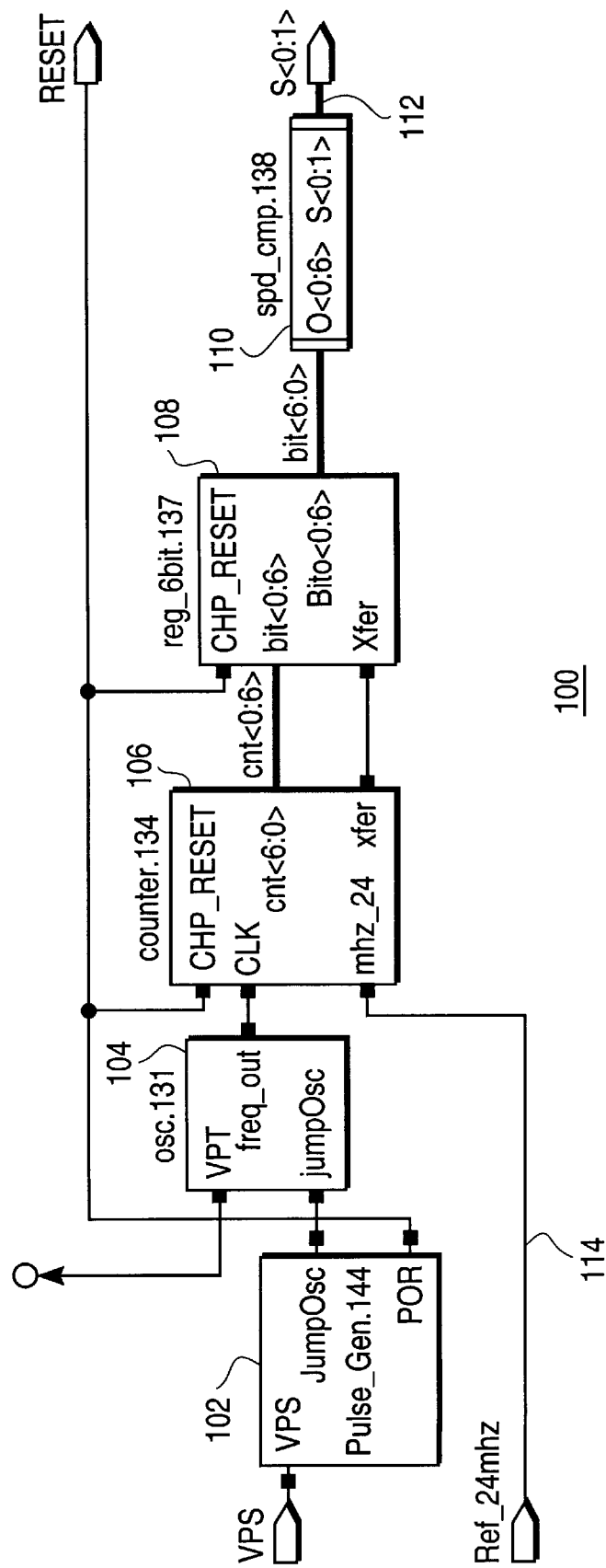
FIG. 1 is a block diagram of a circuit for measuring the speed of an integrated circuit according to an embodiment of the present invention.

FIG. 1 is a block diagram of a circuit according to an embodiment of the present invention for measuring the speed of an integrated circuit. The measuring circuit 100 is shown to include a pulse injector 102, an oscillator 104, a counter 106, a register 108, and a digital speed comparator 110. The pulse injector 102 injects a small logic pulse to the oscillator 104 to ensure that the oscillator 104 starts. The oscillator 104 may be a free running oscillator that is part of a die on a wafer that generates natural frequencies attributable to the die on the wafer. The circuit 100 may be coupled with each die on the wafer so that the oscillator 104 oscillates with the natural frequency attributed to its corresponding die on the wafer.

The resulting frequency of the oscillator 104 is input into the counter 106. In addition to the oscillator signal, the counter 106 also receives a reference signal 114. The reference signal 114 may be a signal at a predetermined frequency, such as a 24 MHz signal. Every time the oscillator signal becomes positive, the counter 106 starts and every time the signal becomes negative, the counter 106 stops. The counter 106 produces a binary number representing the type of frequency related to the natural frequency attributed to the die, as produced by oscillator 104.

An example of the type of die represented by the binary number produced by the counter 106 includes fast, typical, and slow. The range of frequencies that represent fast, typical, and slow may be selected by a designer and is variable. Examples of the frequency ranges that may represent fast, typical, and slow are above 54 counts, 36–54, and 0–36, respectively. Counts are a ratio of natural frequency Vs the frequency of a crystal. Examples of crystal frequencies that may be used are approximately 24 MHz or approximately 15 MHz. The crystal frequency may be delivered via the reference signal 114. A range of frequencies that fall into a typical range is determined by the technology. Parameters are determined by the application and those parameters define a typical range. Wafer frequencies that are higher than the typical range fall into the fast range. Likewise, wafer frequencies that are lower than the typical range fall into the slow range.

The binary number produced by the counter 106 may then be sent to the register 108. An example of the size of the register is a 6 bit register. The primary function of the register 108 is to store the number that is generated by the counter 106. The binary number is sent from the register 108 into the digital speed comparator 110.

The digital speed comparator 110 translates the binary number received from the register 108 into various states that represent wafer types such as slow, typical, and fast circuits. For example, a counter number ranging from 0 to 36 may result in an output of the digital speed comparator 110 of "00", representing a slow circuit; a counter number ranging from 36 to 54 may result in an output of the digital speed comparator 110 of "01", representing a typical circuit; and a counter number ranging from 54 to 127 may result in an output of the digital speed comparator 110 of "10", representing a fast circuit. The output of the digital speed comparator 110 is sent via connection 112 to a frequency synthesizer 200 of FIG. 2.

Figure 2:
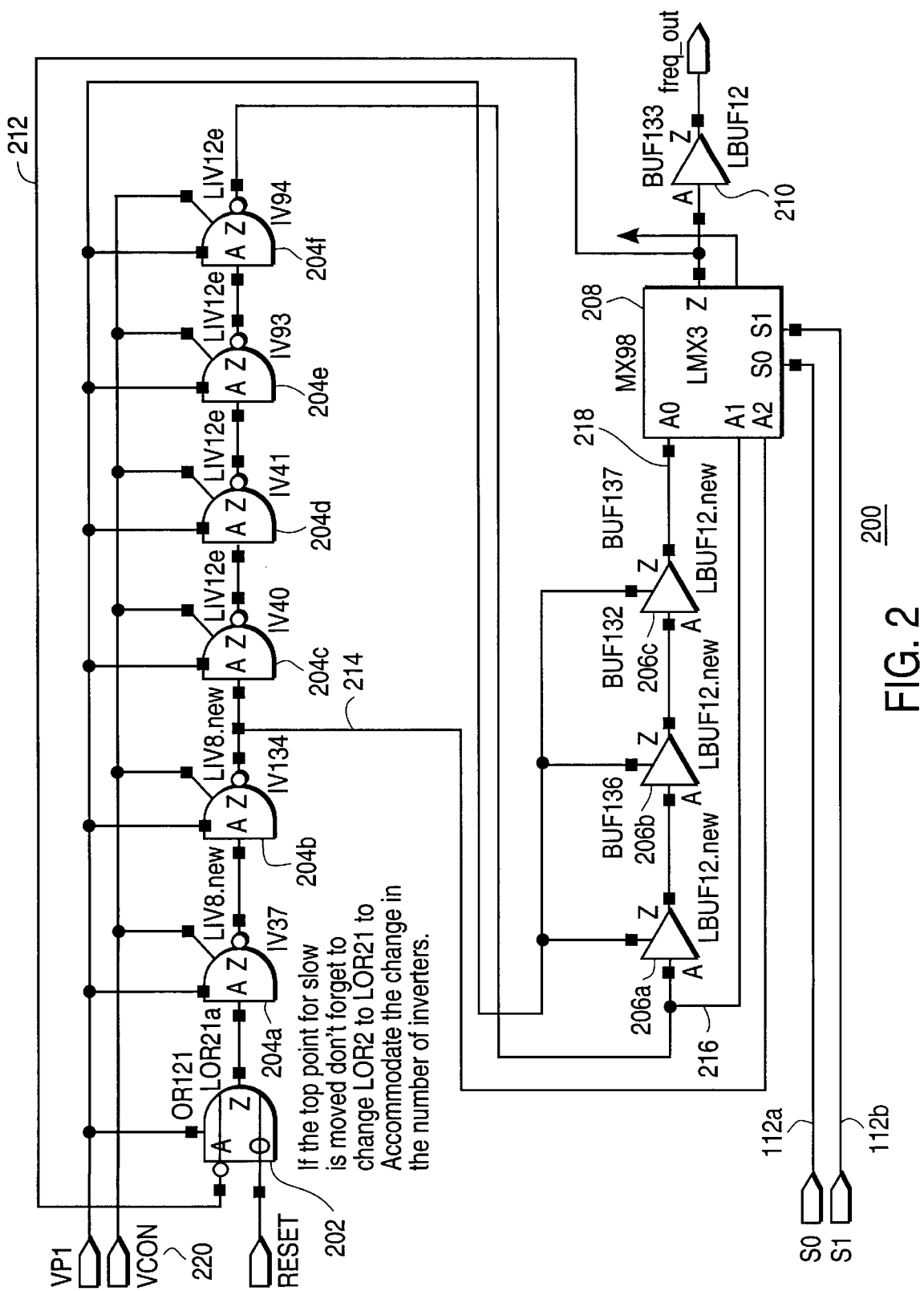
FIG. 2 is a block diagram of a circuit for adjusting a frequency produced by an integrated circuit according to an embodiment of the present invention.

The frequency synthesizer circuit 200 of FIG. 2 is shown to include an OR gate 202, a series of NAN gates 204A–204F, a series of buffers 206A–206C, a multiplexer (MUX) 208, and another buffer 210. Buffers 206A–206C may be standard buffers used to provide a delay to the signal, such as LBUF12, manufactured by Siemens. The buffer 210 is preferably a large buffer such as buffer LBUF32 manufactured by Siemens, in order to isolate the oscillation from the loads. Buffer 210 may be of a size that allows the driving of multiple gates, such as a buffer capable of driving 700 gates.

According to an embodiment of the present invention, two inputs 112A and 112B are sent from the digital speed comparator 110 to the frequency synthesizer circuit 200. The inputs 112A, 112B are sent to the MUX which analyzes the combination of signals 112A and 112B to determine which one of the paths of the circuit 200 a resulting signal should take.

Examples of signals provided by various combinations of signal 112A and 112B include "00", "11", "01", and "10". These combinations may select one of a plurality of paths, for example, "00" may select a path corresponding to a slow die, "01" may select a path corresponding to a typical die, and "10" may select a path corresponding to a fast die.

If the die is a slow die, then a signal is generated from the MUX 208, transported via connections 212 to the OR gate 202 and through the NAN gates 204A–204B prior to going back to the MUX 208 via connection 214. If the resulting signal is a typical signal, then a signal is generated and carried through connection 212 to the OR gate 202, through NAN gates 204A–204F, and carried through connection 216 back to the MUX 208. If the resulting signal is a fast signal, then a signal is sent form the MUX 208, carried through connection 212, past through the OR gate 202, the NAN gates 204A–204F, and through buffers 206A–206C and back to the MUX 208 via connection 218.

Accordingly, a signal generated by a slow die moves through the shortest path, a signal generated by a fast die moves through the longest path, and a signal generated by a typical die moves through a path that is longer than the path taken by the signal generated by the slow die but shorter than the path taken by the signal generated by the fast die. As a result, the signal generated by a slow die is sped up by passing through the shortest path of circuit 200, and the signal generated by a fast die is slowed down by passing through the longest path of circuit 200. Accordingly, when multiple dies are coupled with circuits 100 and 200, then the resulting signals generated by these dies are adjusted to be approximately the same frequency or within a small range of frequencies within a predetermined frequency.

The circuit 200 also has an input 220 which may control the frequency of the oscillation of the signal in an attempt to encourage the oscillation of the signal to be as close to a predetermined frequency as possible. The input 220 may be used in conjunction with the inputs 112A and 112B by allowing inputs 112A and 112B to define a general type of signal frequencies, such as slow, typical, and fast, and then allow input 220 to encourage the oscillation of the signal to get as close to a predetermined frequency as possible.

Figure 3:
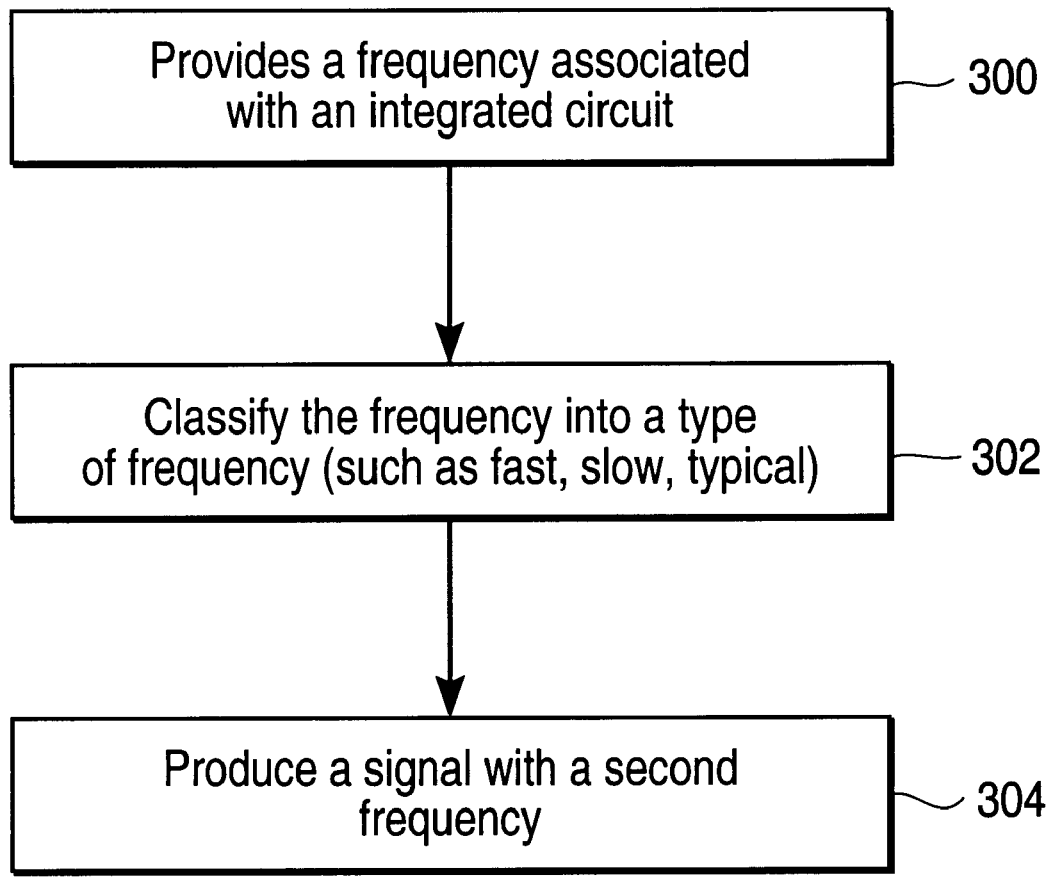
FIG. 3 is a flow diagram of a method according to an embodiment of the present invention for adjusting a frequency produced by an integrated circuit.

FIG. 3 is a flow diagram of a method according to an embodiment of the present invention for adjusting the frequency produced by an integrated circuit. A frequency associated with an integrated circuit is provided (step 300). The frequency is then classified to a type (step 302). A signal is then produced, wherein the signal has a second frequency (step 304).

Although the present invention has been described in accordance with the embodiment shown, one of ordinary skill in the art will readily recognize that there could be variations to the embodiment and these variations would be within the spirit and scope of the present invention. Accordingly, many modifications may be made by one of ordinary skill in the art without departing from the spirit and scope of the appended claims.

What is claimed is:

1. A system for adjusting a frequency produced by an integrated circuit, comprising:

an oscillator reflecting a first frequency of an integrated circuit;

a speed comparator coupled with the oscillator, the speed comparator being configured to classify the first frequency to a type operable to determine a path; and a frequency synthesizer coupled with the speed comparator, wherein the frequency synthesizer uses the path to produce a signal with a second frequency.

2. The system of claim 1, wherein a first type produces the signal by using a path with a first length.

3. The system of claim 2, wherein a second type produces the signal by using a path with a second length.

4. The system of claim 3, wherein a third type produces the signal by using a path with a third length.

5. The system of claim 3, wherein the first length is longer than the second length.

6. The system of claim 4, wherein the third length is longer than the second length and shorter than the first length.

7. The system of claim 2, wherein the first type is a fast type.

8. The system of claim 3, wherein the second type is a slow type.

9. The system of claim 4, wherein the third type is a typical type.

* * * * *